US008653651B2

(12) United States Patent
Uchida et al.

(10) Patent No.: US 8,653,651 B2
(45) Date of Patent: Feb. 18, 2014

(54) SEMICONDUCTOR APPARATUS AND METHOD FOR MANUFACTURING THE SAME

(75) Inventors: Masayuki Uchida, Kanagawa-ken (JP);
Takashi Togasaki, Kanagawa-ken (JP);
Satoru Hara, Kanagawa-ken (JP);
Kentaro Suga, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/405,665

(22) Filed: Feb. 27, 2012

(65) Prior Publication Data
US 2012/0235291 A1  Sep. 20, 2012

(30) Foreign Application Priority Data

Mar. 17, 2011 (JP) ................. 2011-059355

(51) Int. Cl.
*H01L 23/34* (2006.01)
(52) U.S. Cl.
USPC ........... 257/718; 257/675; 257/706; 257/707; 257/719; 257/E23.051; 257/E23.08; 257/E23.086
(58) Field of Classification Search
USPC .......... 257/678, 706, 707, E33.075, E31.131, 257/E23.051, E23.08, E23.086; 438/122, 438/FOR. 413
See application file for complete search history.

(56) References Cited

U.S. PATENT DOCUMENTS

| 6,841,887 | B2 | 1/2005 | Araki | |
|---|---|---|---|---|
| 7,215,020 | B2 * | 5/2007 | Nakase et al. | 257/706 |
| 7,863,731 | B2 * | 1/2011 | Chen et al. | 257/706 |
| 2005/0093131 | A1 | 5/2005 | Nakase et al. | |

FOREIGN PATENT DOCUMENTS

| DE | 100 58 446 A1 | 5/2001 |
|---|---|---|
| DE | 10 2004 052 653 A1 | 6/2005 |
| JP | 2006-49777 A | 2/2006 |
| JP | 2009-125753 A | 6/2009 |
| JP | 2009-158787 A | 7/2009 |
| JP | 2010-10574 | 1/2010 |
| JP | 2010-40651 A | 2/2010 |

OTHER PUBLICATIONS

German Office Action Issued Apr. 24, 2013 in Patent Application No. 10 2012 204 085.4 (with English translation).
Japanese Office Action issued Mar. 27, 2013 in Patent Application No. 2011-059355 with English Translation.

* cited by examiner

*Primary Examiner* — Jasmine Clark
(74) *Attorney, Agent, or Firm* — Oblon, Spivak, McClelland, Maier & Neustadt, L.L.P.

(57) ABSTRACT

According to one embodiment, a semiconductor apparatus includes a semiconductor device, a heat spreader, a regulating unit, a containing unit, and a holding unit. The heat spreader is bonded to the semiconductor device with an interposed solder layer. The regulating unit is configured to regulate a dimension between the semiconductor device and the heat spreader. The containing unit is configured to contain melted solder in an interior of the containing unit. The holding unit is configured to allow melted solder held in an interior of the holding unit. The holding unit is configured to replenish the melted solder in the case where an amount of the melted solder contained in the containing unit is insufficient. The holding unit is configured to recover the melted solder in the case where the amount of the melted solder contained in the containing unit is excessive.

8 Claims, 4 Drawing Sheets

SEMICONDUCTOR APPARATUS AND METHOD FOR MANUFACTURING THE SAME

CROSS-REFERENCE TO RELATED APPLICATIONS

This application is based upon and claims the benefit of priority from the prior Japanese Patent Application No. 2011-059355, filed on Mar. 17, 2011; the entire contents of which are incorporated herein by reference.

FIELD

Embodiments described herein relate generally to a semiconductor apparatus and method for manufacturing the same.

BACKGROUND

A modular semiconductor apparatus is known in which heat spreaders have solder bonds to power semiconductor devices such as an IGBT (Insulated gate bipolar transistor), an IEGT (Injection Enhanced Gate Transistor), a MOS-FET (Metal-Oxide-Semiconductor Field-Effect Transistor), a diode, etc., to improve the heat dissipation of the semiconductor devices.

Technology has been proposed to control the tilt of the semiconductor device in such a semiconductor apparatus by providing spacers and/or protruding portions between the semiconductor device and the heat spreader and by providing solder basins with the same configuration at four corners of the semiconductor device.

However, it is difficult to increase the precision of the separation dimension between the semiconductor device and the heat spreader. Therefore, there is a risk that excess solder may overflow or an underfill portion may occur due to an insufficient solder amount in the case where the semiconductor device is bonded to the heat spreader using a predetermined amount of solder.

Therefore, there is a risk that the reliability of the semiconductor apparatus may decrease.

DETAILED DESCRIPTION

Figure 1A:
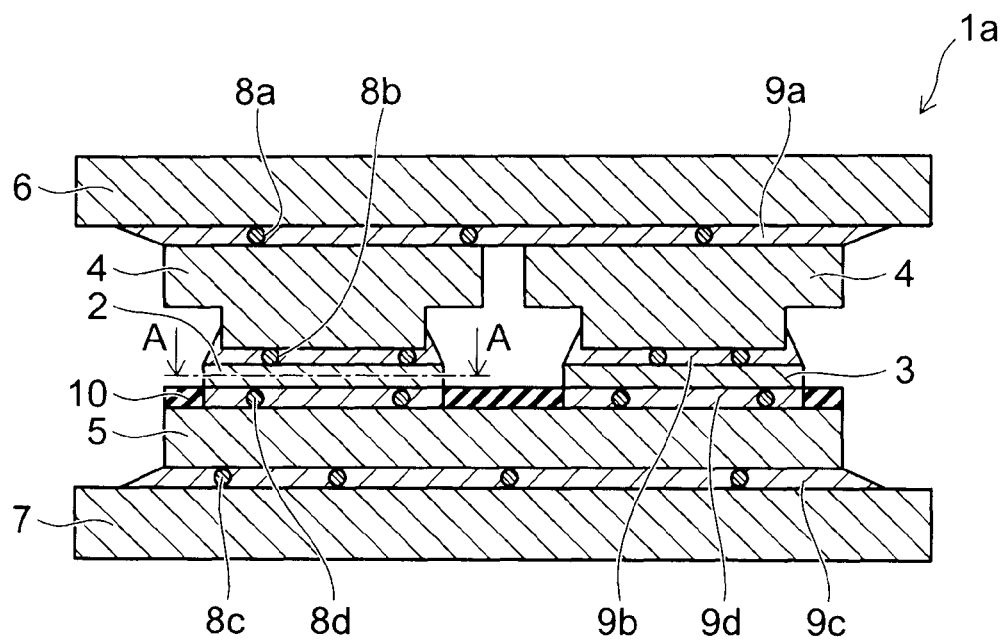
FIGS. 1A and 1B are schematic cross-sectional views illustrating a semiconductor apparatus according to a first embodiment.

In general, according to one embodiment, a semiconductor apparatus includes a semiconductor device, a heat spreader, a regulating unit, a containing unit, and a holding unit. The heat spreader is bonded to the semiconductor device with an interposed solder layer. The regulating unit is provided between the semiconductor device and the heat spreader. The regulating unit is configured to regulate a dimension between the semiconductor device and the heat spreader. The containing unit is provided outside a region of the bond of the semiconductor device to the heat spreader. The containing unit is configured to contain melted solder in an interior of the containing unit. The holding unit is configured to allow melted solder held in an interior of the holding unit to flow between the holding unit and the containing unit. The holding unit is configured to replenish the melted solder in the case where an amount of the melted solder contained in the containing unit is insufficient when cooling the melted solder. The holding unit is configured to recover the melted solder in the case where the amount of the melted solder contained in the containing unit is excessive when cooling the melted solder.

Embodiments will now be described with reference to the drawings. Similar components in the drawings are marked with like reference numerals, and a detailed description is omitted as appropriate.

First Embodiment

Figure 1B:
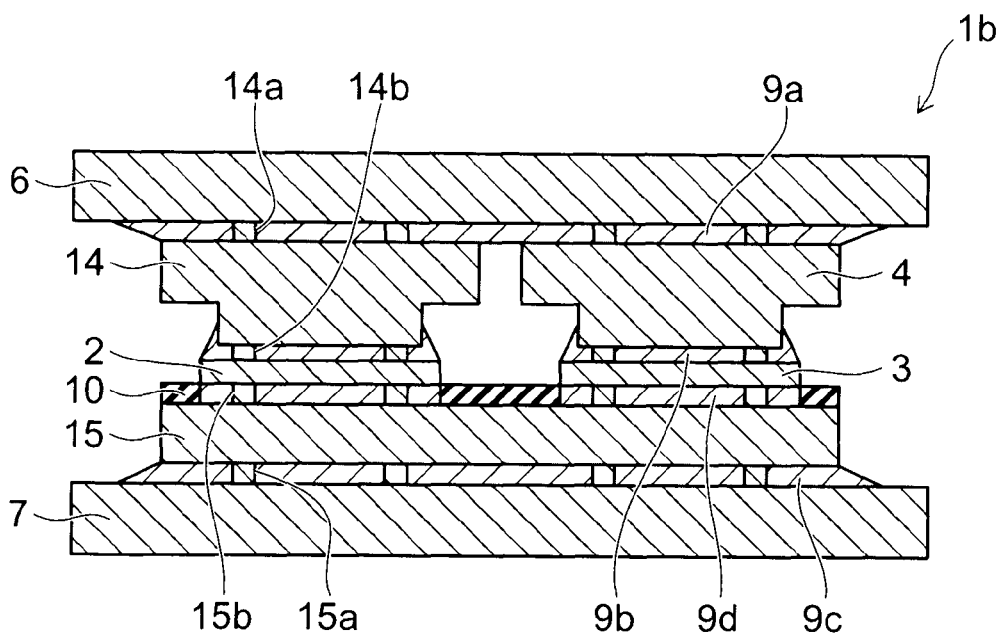

FIGS. 1A and 1B are schematic cross-sectional views illustrating a semiconductor apparatus according to a first embodiment.

FIG. 1A is a schematic cross-sectional view illustrating a semiconductor apparatus that includes spacers; and FIG. 1B is a schematic cross-sectional view illustrating a semiconductor apparatus that includes protruding portions.

Figure 2A:
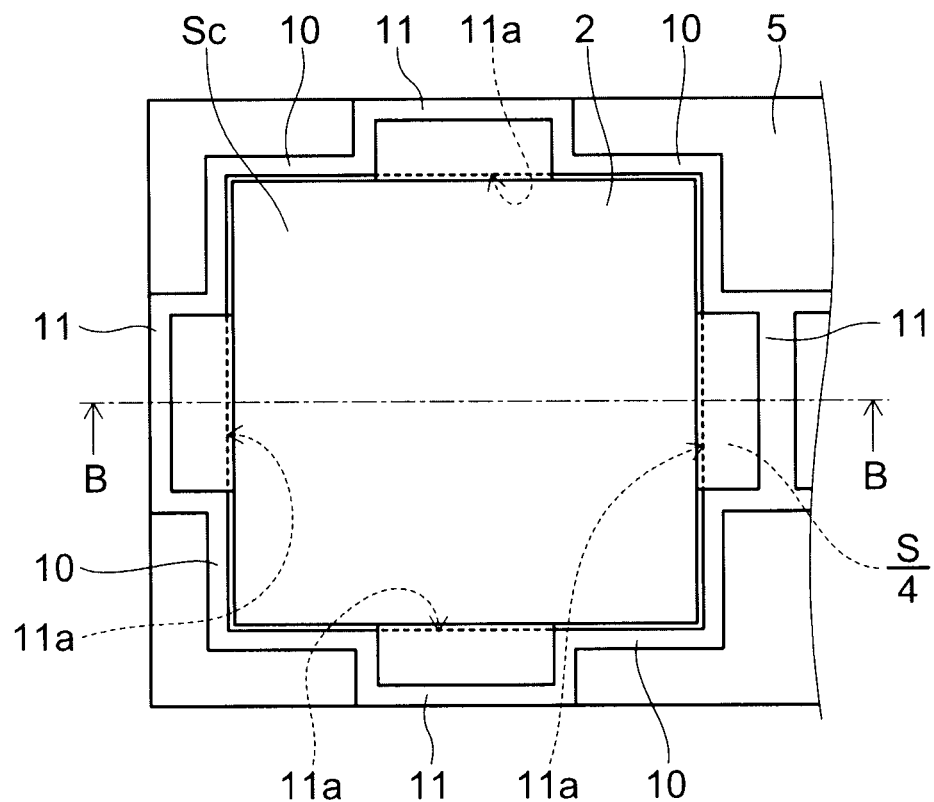
FIGS. 2A and 2B are schematic views illustrating a holding unit.
Figure 2B:
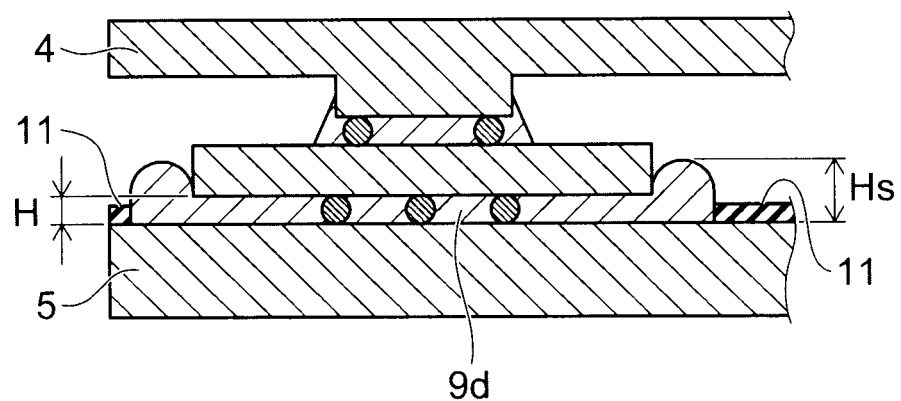

FIGS. 2A and 2B are schematic views illustrating a holding unit.

FIG. 2A is a view along arrows A-A of FIG. 1A; and FIG. 2B is a view along arrows B-B of FIG. 2A.

Figure 3:
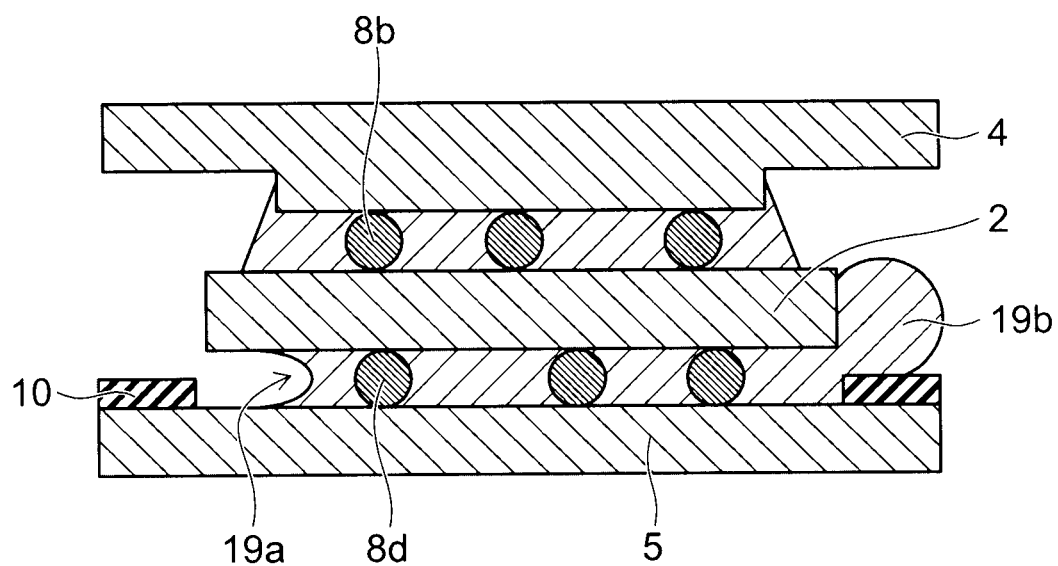
FIG. 3 is a schematic cross-sectional view illustrating a semiconductor apparatus according to a comparative example.

FIG. 3 is a schematic cross-sectional view illustrating a semiconductor apparatus according to a comparative example.

FIG. 3 is the case where only a containing unit 10 is provided without providing the holding unit 11.

As illustrated in FIG. 1A, the semiconductor apparatus 1a includes semiconductor devices 2 and 3, heat spreaders 4 and 5, bus bars 6 and 7, spacers 8a to 8d, solder layers 9a to 9d, and the containing unit 10.

As illustrated in FIG. 1B, the semiconductor apparatus 1b includes the semiconductor devices 2 and 3, heat spreaders 14 and 15, the bus bars 6 and 7, the solder layers 9a to 9d, and the containing unit 10. Protruding portions 14a, 14b, 15a, and 15b described below and the spacers 8a to 8d are regulating units configured to regulate the dimensions between the components.

For example, the spacer 8d and the protruding portion 15b are regulating units provided between the semiconductor devices 2 and 3 and the heat spreaders 5 and 15 to regulate the dimensions between the semiconductor devices 2 and 3 and the heat spreaders 5 and 15.

The semiconductor devices 2 and 3 may be, for example, power semiconductor devices and the like such as IGBTs, IEGTs, MOS-FETs, diodes, etc.

In such a case, the semiconductor devices 2 and 3 may be the same type of semiconductor device or may be different types of semiconductor devices.

For example, in the case where an inverter control circuit is formed, one selected from the semiconductor devices 2 and 3 may be an IGBT used as a switching device; and the other selected from the semiconductor devices 2 and 3 may be a diode used as a freewheeling diode.

The heat spreaders 4, 5, 14, and 15 may be formed using a conductive material.

The heat spreaders 4, 5, 14, and 15 may be formed using, for example, copper, aluminum, copper alloy, aluminum alloy, and the like. To improve the solderability during the solder bond described below, a layer made of nickel, gold, and the like may be provided on the surfaces of the heat spreaders 4, 5, 14, and 15.

Here, for example, in the case where at least one selected from the semiconductor device 2 and the semiconductor device 3 is an IGBT or the like, the heat spreaders 4 and 14 may be so-called emitter plates; and the heat spreaders 5 and 15 may be so-called collector plates.

In the case of the apparatuses illustrated in FIGS. 1A and 1B, the heat spreader 4 or the heat spreader 14 is provided for each of the semiconductor devices 2 and 3; and the heat spreader 5 or the heat spreader 15 is provided for each of the semiconductor devices 2 and 3.

One major surface of the heat spreader 4 or 14 has a solder bond to one major surface of the bus bar 6 via the solder layer 9a; and one other major surface of the heat spreader 4 or 14 has a solder bond to one major surface of each of the semiconductor devices 2 and 3 via the solder layer 9b.

One major surface of the heat spreader 5 or 15 has a solder bond to one major surface of the bus bar 7 via the solder layer 9c; and one other major surface of the heat spreader 5 or 15 has a solder bond to one other major surface of each of the semiconductor devices 2 and 3 via the solder layer 9d.

The bus bars 6 and 7 may be formed using a conductive material.

The bus bars 6 and 7 may be formed using, for example, copper, aluminum, copper alloy, aluminum alloy, and the like. To improve the solderability, a layer made of nickel, gold, and the like also may be provided on the surfaces of the bus bars 6 and 7.

Here, thin and thick regions may occur partially in the solder layers 9a to 9d if the separation dimension between the semiconductor devices 2 and 3 and the heat spreaders 4, 5, 14, and 15, the separation dimension between the heat spreaders 4 and 14 and the bus bar 6, and the separation dimension between the heat spreaders 5 and 15 and the bus bar 7 are not controlled; and there is a risk that portions that are fragile during thermal stress may occur and the heat dissipation may worsen.

Therefore, in the semiconductor apparatus 1a, the control of these separation dimensions is performed by providing the spacers 8a to 8d as the regulating units described above.

The spacers 8a to 8d may have, for example, spherical configurations.

The spacer 8a is provided between the heat spreader 4 and the bus bar 6.

The spacer 8b is provided between the heat spreader 4 and the semiconductor devices 2 and 3.

The spacer 8c is provided between the heat spreader 5 and the bus bar 7.

The spacer 8d is provided between the heat spreader 5 and the semiconductor devices 2 and 3.

The size and the material properties of the spacers 8a to 8d are not particularly limited and may be set appropriately. In this case, the heat dissipation and the thermal fatigue resistance can be improved by providing spherical spacers 8a to 8d with a diametrical dimension of not less than 25 µm and not more than 85 µm.

The wettability of the solder can be improved in the case where the spacers 8a to 8d are formed using nickel, copper, and the like.

The control of the separation dimensions during the solder bond can be performed by pressurizing the stacked body in which the bus bar 7, the spacer 8c, the heat spreader 5, the spacer 8d, the semiconductor devices 2 and 3, the spacer 8b, the heat spreader 4, the spacer 8a, and the bus bar 6 are stacked. In other words, the control of the separation dimensions can be performed by the spacers 8a to 8d being interposed.

In the semiconductor apparatus 1b, the control of the separation dimensions described above is performed by providing the protruding portions 14a and 14b on the heat spreader 14 and by providing the protruding portions 15a and 15b on the heat spreader 15.

In other words, in the semiconductor apparatus 1b, the control of these separation dimensions is performed by providing the protruding portions 14a, 14b, 15a, and 15b as the regulating units described above.

The protruding portion 14a is provided between the heat spreader 14 and the bus bar 6.

The protruding portion 14b is provided between the heat spreader 14 and the semiconductor devices 2 and 3.

The protruding portion 15a is provided between the heat spreader 15 and the bus bar 7.

The protruding portion 15b is provided between the heat spreader 15 and the semiconductor devices 2 and 3.

The protruding portions 14a, 14b, 15a, and 15b have, for example, columnar configurations.

The sizes of the protruding portions 14a, 14b, 15a, and 15b are not particularly limited and may be set appropriately.

Although the case is illustrated where the protruding portions are provided on the heat spreaders, the protruding portions 14a, 14b, 15a, and 15b also may be provided on the semiconductor devices 2 and 3 and on the bus bars 6 and 7.

In such a case, the heat dissipation and the thermal fatigue resistance can be improved by providing columnar protruding portions 14a, 14b, 15a, and 15b with a height dimension not less than 25 µm and not more than 85 µm.

The wettability of the solder can be improved by forming a layer made of nickel, gold, and the like on the surfaces of the protruding portions 14a, 14b, 15a, and 15b.

The control of the separation dimensions can be performed during the solder bond by pressurizing the stacked body in which the bus bar 7, the heat spreader 15 having the protruding portions 15a and 15b, the semiconductor devices 2 and 3, the heat spreader 14 having the protruding portions 14a and 14b, and the bus bar 6 are stacked. In other words, the control of the separation dimensions can be performed by the protruding portions 14a, 14b, 15a, and 15b being interposed.

The solder layers 9a to 9d may be formed of a solder bond using, for example, lead-free solder having a main component of tin.

The solder layers 9a to 9d electrically connect the semiconductor devices 2 and 3 to the heat spreaders 14 and 15 and the bus bars 6 and 7.

The solder layers 9a to 9d form a portion of the heat path when the heat generated at the semiconductor devices 2 and 3 is emitted by the heat spreaders 14 and 15 and the bus bars 6 and 7.

The solder layers 9a to 9d relieve the thermal stress generated between the semiconductor devices 2 and 3 and the heat spreaders 14 and 15.

The containing unit 10 and the holding unit 11 will now be described.

Although an example is described in which the containing unit 10 and the holding unit 11 are provided for the semiconductor device 2, this is similar when the containing unit 10 and the holding unit 11 are provided for the semiconductor device 3.

Although FIG. 2A is a view along arrows A-A of FIG. 1A, this is similar for the corresponding portions of FIG. 1B.

The containing unit 10 is provided outside the region where the heat spreader 5 is bonded to the semiconductor device 2; and melted solder is contained in the interior of the containing unit 10

For example, in the case where the planar configuration of the semiconductor device 2 is rectangular as illustrated in FIG. 2A, the containing unit 10 may have portions substantially parallel to the sides of the rectangle. Then, the region defined by the portions substantially parallel to the sides of the rectangle is the interior of the containing unit 10 that is configured to contain the melted solder.

In such a case, as illustrated in FIG. 2A, the containing unit 10 may have a frame-like configuration; and the line width dimension of the frame-like containing unit 10 may be not less than 0.5 mm.

The containing unit 10 is provided outside the outer edge of the semiconductor device 2.

The containing unit 10 is provided to protrude from the major surface of the heat spreader 5 on the side where the heat spreader 5 is bonded to the semiconductor device 2; and the melted solder can be contained in the interior of the containing unit 10.

By providing the containing unit 10, shifting of the position of the semiconductor device 2 also can be suppressed.

In such a case, the positional shifting of the semiconductor device can be reduced further by reducing the dimension between the outer edge of the semiconductor device 2 and the inner edge of the containing unit 10 when viewed in plan.

For example, the dimension between the outer edge of the semiconductor device 2 and the inner edge of the containing unit 10 may be about 0 mm to 0.2 mm.

The thickness dimension of the containing unit 10 may be, for example, about the same as the diametrical dimension of the spacer 8d and the height dimension of the protruding portion 15b.

For example, the thickness dimension of the containing unit 10 may be not less than 25 μm and not more than 85 μm. The material of the containing unit 10 is not particularly limited; and a material having thermal stability with respect to the melted solder may be appropriately selected.

The containing unit 10 may be formed by, for example, coating a thermosetting resin in a prescribed configuration by screen printing, inkjet, and the like, and by thermally curing the thermosetting resin.

Here, the amount of the solder used in the solder bond can be constant by performing the control of the separation dimensions described above by providing the spacers 8a to 8d and the protruding portions 14a, 14b, 15a, and 15b.

However, the separation dimensions described above fluctuate because there is fluctuation in the dimensions of the spacers 8a to 8d and the protruding portions 14a, 14b, 15a, and 15b.

Therefore, in the case where the amount of the solder used in the solder bond is constant, there is a risk that an underfill portion 19a in which the solder amount is insufficient and an overflow portion 19b in which the solder amount is excessive may occur as illustrated in FIG. 3.

In the case where such an underfill portion 19a occurs, there is a risk that portions that are fragile during thermal stress may occur and the heat dissipation may worsen.

In the case where the overflow portion 19b occurs, there is a risk that shorts may occur between one major surface of the semiconductor device 2 and one other major surface of the semiconductor device 2 or between adjacent semiconductor devices 3.

Therefore, in this embodiment, the occurrence of the underfill portion 19a and the overflow portion 19b is suppressed by providing the holding unit 11.

The holding unit 11 is configured to allow the melted solder held in the interior of the holding unit 11 to flow between the holding unit 11 and the containing unit 10. For example, when cooling the melted solder, the holding unit 11 replenishes the melted solder in the case where the amount of the melted solder contained in the containing unit 10 is insufficient and recovers and holds the melted solder in the case where the amount of the melted solder is excessive.

The holding unit 11 is provided to protrude outward from the containing unit 10 to contain the melted solder in the interior. The holding unit 11 has an opening 11a configured to open into the interior of the containing unit 10; and the opening 11a is provided to face the outer edge of the semiconductor device 2 when viewed in plan. The flow of the melted solder between the holding unit 11 and the containing unit 10 can be easy by providing such an opening 11a.

The replenishing or the recovering/holding of the solder according to the insufficient or excessive solder amount supplied between the semiconductor device 2 and the heat spreader 5 can be easy by providing the holding unit 11. Therefore, the reliability of the semiconductor apparatus can be increased because the occurrence of the underfill portion 19a and the overflow portion 19b illustrated in FIG. 3 can be suppressed.

In such a case, at least a pair of the holding units 11 may be provided to oppose each other when viewed in plan. Thus, the occurrence of the underfill portion 19a and the overflow portion 19b can be suppressed further because the replenishing or the recovering of the solder can be performed from at least two sides of the semiconductor device 2.

Multiple pairs in which the holding units 11 oppose each other may be provided (two pairs are illustrated in FIG. 2A).

The thickness dimension of the holding unit 11 may be about the same as the thickness dimension of the containing unit 10. In the case where the holding unit 11 is formed from a line-shaped portion connected to the containing unit 10 when viewed in plan, the line width dimension of the containing unit 10 may be about the same as the line width dimension of the containing unit 10. The material of the holding unit 11 may be the same as the material of the containing unit 10; and the containing unit 10 and the holding unit 11 may be formed simultaneously.

According to knowledge obtained by the inventor, the occurrence of the underfill portion 19a and the overflow portion 19b can be suppressed more reliably by a total surface area S of the holding unit 11 satisfying the following Formula 1 when viewed in plan:

$$S \geq \frac{0.38 \times S_c \times H}{H_s} \qquad \text{[Formula 1]}$$

where S is the total surface area of the holding unit 11 when viewed in plan, Sc is the surface area of the semiconductor device when viewed in plan, H is the dimension between the semiconductor device and the heat spreader, and Hs is the maximum height dimension of the melted solder held in the interior of the holding unit 11 as illustrated in FIGS. 2A and 2B.

For example, in the case where four holding units 11 are provided as illustrated in FIG. 2A, the total surface area S is the sum of the surface areas of the four holding units 11. In such a case, if the surface areas of the holding units 11 are equal, the surface area of one of the holding units 11 is S/4.

The maximum height dimension H of the melted solder held in the interior of the holding unit 11 may be set appropriately by considering the thickness dimension of the holding unit 11, the surface tension of the melted solder, the viscosity of the melted solder, etc. For example, the maximum height dimension H may be determined by performing experiments and/or simulations beforehand.

The upper limit of the total surface area S of the holding unit 11 may be determined appropriately by considering the space efficiency and the like.

Figure 4A:
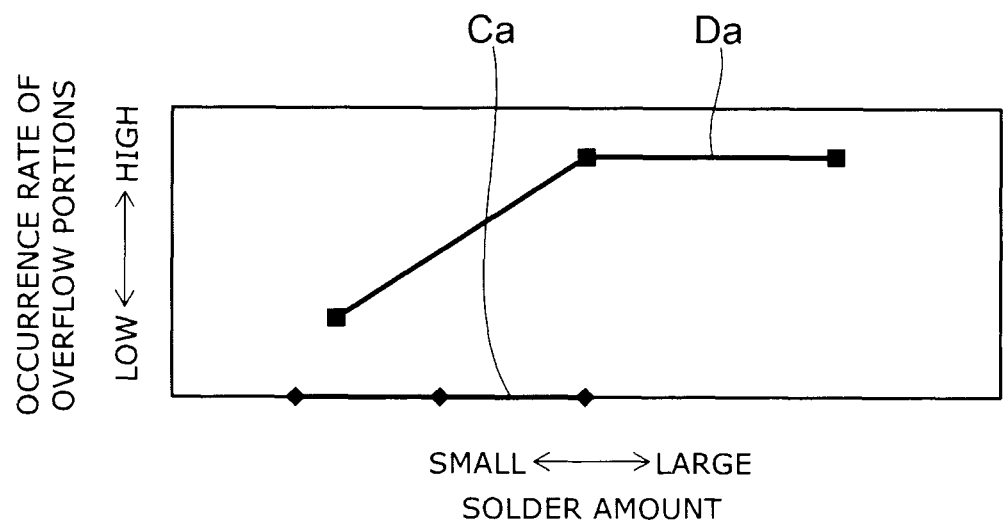
FIGS. 4A and 4B are schematic graphs illustrating the effects in the case where the holding unit is provided.
Figure 4B:
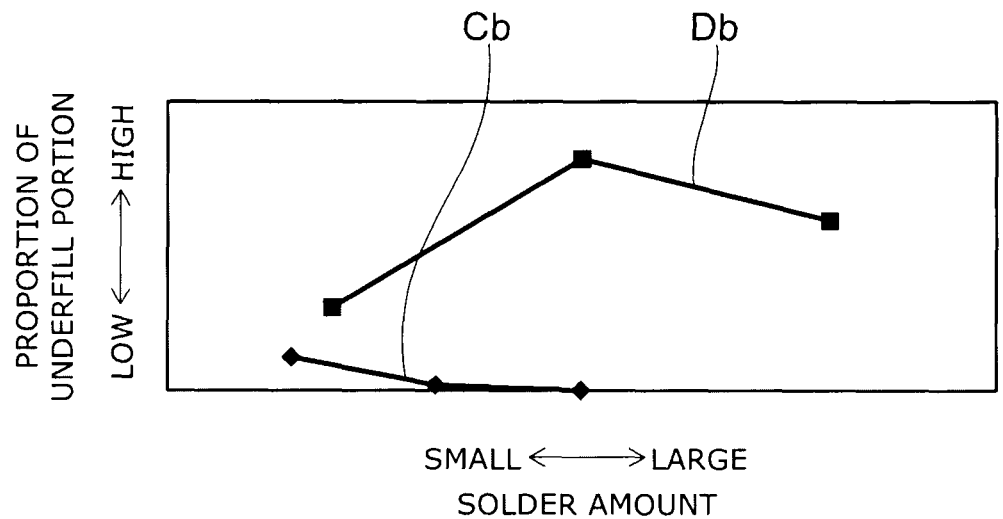

FIGS. 4A and 4B are schematic graphs illustrating the effects in the case where the holding unit is provided. FIG. 4A is a schematic graph illustrating the relationship between the amount of the solder used in the solder bond and the occurrence rate of the overflow portion 19b; and FIG. 4B is a schematic graph illustrating the relationship between the amount of the solder used in the solder bond and the proportion of the surface area of the underfill portion 19a to the surface area of the semiconductor device.

In FIG. 4A, Ca is the case where the holding unit 11 is provided; and Da is the case where the holding unit 11 is not provided. In FIG. 4B, Cb is the case where the holding unit 11 is provided; and Db is the case where the holding unit 11 is not provided.

It can be seen from FIGS. 4A and 4B that the occurrence of the underfill portion 19a and the overflow portion 19b can be drastically reduced by providing the holding unit 11.

The occurrence of the underfill portion 19a and the overflow portion 19b can be drastically reduced regardless of the amount of the solder used in the solder bond.

Therefore, the reliability of the semiconductor apparatus can be increased.

Second Embodiment

A method for manufacturing a semiconductor apparatus according to a second embodiment will now be described.

First, the semiconductor devices 2 and 3, the heat spreaders 4 and 5, the bus bars 6 and 7, the spacers 8a to 8d, etc., are formed.

In the case where the heat spreaders 14 and 15 are used, the protruding portions 14a and 14b are formed on the heat spreader 14, and the protruding portions 15a and 15b are formed on the heat spreader 15.

The protruding portions 14a, 14b, 15a, and 15b may be formed on the semiconductor devices 2 and 3 and the bus bars 6 and 7. For example, the protruding portions 14a, 14b, 15a, and 15b may be formed by coating a thermosetting resin such as a thermosetting resist and the like in a prescribed configuration by inkjet and the like and by thermally curing in the wafer state prior to singulating the semiconductor devices 2 and 3.

The other components can be formed by applying known technology, and a description thereof is omitted.

Then, the containing unit 10 and the holding unit 11 are formed in the prescribed configuration on the heat spreader 5 or the heat spreader 15.

In other words, the containing unit 10 and the holding unit 11 are provided outside the region where the heat spreader 5 or the heat spreader 15 is bonded to the semiconductor devices 2 and 3; the containing unit 10 is configured to contain the melted solder in the interior of the containing unit 10; and the holding unit 11 is configured to allow the melted solder held in the interior of the holding unit 11 to flow between the holding unit 11 and the containing unit 10.

For example, the containing unit 10 and the holding unit 11 may be formed by coating a thermosetting resin such as a thermosetting resist and the like in the prescribed configuration by screen printing, inkjet, and the like and then thermally curing.

In such a case, for example, the thickness dimensions of the containing unit 10 and the holding unit 11 may be not less than about 25 μm and not more than about 85 μm; the line width dimensions of the containing unit 10 and the holding unit 11 may be not less than about 0.5 mm; and the dimension between the outer edge of the semiconductor device and the inner edge of the containing unit 10 may be about 0 mm to 0.2 mm.

The total surface area S of the holding unit 11 may satisfy Formula 1 described above when viewed in plan.

The heating temperature may be about 150° C.; and the heating time may be about one hour.

Continuing, the regulating units are provided between the components to regulate the dimensions between the components.

For example, the spacer 8d is provided between the semiconductor devices 2 and 3 and the heat spreader 5 as the regulating unit to regulate the dimension between the semiconductor devices 2 and 3 and the heat spreader 5. Or, the protruding portion 15a is provided between the semiconductor devices 2 and 3 and the heat spreader 15 as the regulating unit to regulate the dimension between the semiconductor devices 2 and 3 and the heat spreader 15.

Then, the stacked body is formed by supplying solder pellets used to form the solder layers 9a to 9d on the solder bond surfaces of the components and by stacking the components.

At this time, a prescribed amount of solder pellets is supplied to the interior of the containing unit 10 and the interior of the holding unit 11.

For example, the stacked body is formed by supplying the prescribed amount of solder pellets to the solder bond surfaces and by stacking the bus bar 7, the spacer 8c, the heat spreader 5, the spacer 8d, the semiconductor devices 2 and 3, the spacer 8b, the heat spreader 4, the spacer 8a, and the bus bar 6

The stacked body may be formed by supplying the prescribed amount of solder pellets including the spacers 8a to 8d and by stacking the bus bar 7, the heat spreader 5, the semiconductor devices 2 and 3, the heat spreader 4, and the bus bar 6.

In other words, the setting of the regulating units may be performed simultaneously with the supplying of the solder. The setting of the regulating units may be performed after the supplying of the solder.

For example, the stacked body may be formed by supplying the prescribed amount of solder pellets on the solder bond surfaces and by stacking the bus bar 7, the heat spreader 15, the semiconductor devices 2 and 3, the heat spreader 14, and the bus bar 6.

Then, the formed stacked body is pressurized such that the components are separated by the prescribed separation dimension.

For example, the semiconductor devices 2 and 3 and the heat spreaders 5 and 15 may be pressurized in a direction toward each other with the regulating units interposed.

Then, the solder pellets are melted by heating the stacked body while this pressurized state is maintained.

The heating of the stacked body may be performed using, for example, a heating furnace and the like.

In such a case, flux suited to the solder pellets may be dropped onto the solder pellets and the heating may be performed with a reducing gas atmosphere inside the heating furnace to suppress the formation of an oxide film.

The occurrence of voids in the solder layers can be suppressed by reducing the pressure inside the heating furnace to remove bubbles inside the melted solder.

Then, the solder layers 9a to 9d are formed on the solder bond surfaces of the components by cooling the melted solder. In other words, solder bonding of the components is performed.

At this time, the replenishing of the solder from the holding unit 11 or the recovering/holding of the excess solder into the holding unit 11 is performed according to the insufficient or excessive solder amount supplied between the semiconductor devices 2 and 3 and the heat spreader 5 (or the heat spreader 15).

In other words, in the process of cooling the melted solder, the melted solder is replenished from the holding unit 11 in the case where the amount of the melted solder contained in the containing unit 10 is insufficient, and the melted solder is recovered and held in the holding unit 11 in the case where the amount of the melted solder is excessive.

Therefore, the reliability of the semiconductor apparatus can be increased because the occurrence of the underfill portion 19a and the overflow portion 19b can be suppressed.

Thus, the semiconductor apparatus 1a and 1b are manufactured.

Although the case is illustrated where the containing unit 10 and the holding unit 11 are provided on the heat spreaders 5 and 15 in the semiconductor apparatus 1a and 1b described above, the containing unit 10 and the holding unit 11 may be provided also on the heat spreaders 4 and 14.

Although the case is illustrated where the solder bond is provided on major surfaces on two sides of the semiconductor devices 2 and 3, this can be applied also to the case where the solder bond is provided only on the major surface of one side of the semiconductor devices. In such a case, the heat spreaders, the bus bars, the spacers, the solder layers, the protruding portions, etc., are unnecessary on the side opposite to the solder bond side.

The heat spreader and the bus bar may be combined.

According to the embodiments described above, a semiconductor apparatus having higher reliability and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For example, the configurations, the dimensions, the material properties, the dispositions, the numbers, etc., of the components included in the semiconductor apparatus 1a and 1b are not limited to those illustrated and may be modified appropriately.

What is claimed is:

1. A semiconductor apparatus, comprising:
a semiconductor device;
a heat spreader bonded to the semiconductor device with an interposed solder layer;
a regulating unit provided between the semiconductor device and the heat spreader, the regulating unit being configured to regulate a dimension between the semiconductor device and the heat spreader;
a containing unit provided outside a region of the bond of the semiconductor device to the heat spreader, the containing unit being configured to contain melted solder in an interior of the containing unit; and
a holding unit configured to allow melted solder held in an interior of the holding unit to flow between the holding unit and the containing unit,
the holding unit being configured to replenish the melted solder in the case where an amount of the melted solder contained in the containing unit is insufficient and configured to recover the melted solder in the case where the amount of the melted solder contained in the containing unit is excessive when cooling the melted solder.

2. The apparatus according to claim 1, wherein the holding unit is provided to satisfy the following formula:

$$S \geq \frac{0.38 \times S_c \times H}{H_s} \quad \text{[Formula 2]}$$

where S is a total surface area of the holding unit when viewed in plan, Sc is a surface area of the semiconductor device when viewed in plan, H is the dimension between the semiconductor device and the heat spreader, and Hs is a maximum height dimension of the melted solder held in the interior of the holding unit.

3. The apparatus according to claim 1, wherein the holding unit includes portions provided to oppose each other when viewed in plan.

4. The apparatus according to claim 1, wherein:
the holding unit has an opening configured to open into the interior of the containing unit; and
the opening is provided to face an outer edge of the semiconductor device when viewed in plan.

5. The apparatus according to claim 1, wherein the holding unit is formed from a line-shaped portion connected to the containing unit when viewed in plan.

6. The apparatus according to claim 1, wherein the containing unit has a frame-like configuration when viewed in plan.

7. The apparatus according to claim 1, wherein:
the semiconductor device is a rectangular shape when viewed in plan; and
the opening is provided to face a side of the semiconductor device when viewed in plan.

8. The apparatus according to claim 2, wherein:
the semiconductor device is a rectangular shape when viewed in plan; and
the opening is provided to face a side of the semiconductor device when viewed in plan.

* * * * *